US008212454B2

(12) United States Patent
Onitsuka et al.

(10) Patent No.: US 8,212,454 B2

(45) Date of Patent: Jul. 3, 2012

(54) PIEZOELECTRIC VIBRATOR, PIEZOELECTRIC VIBRATOR MANUFACTURING METHOD, OSCILLATOR, ELECTRONIC DEVICE, RADIO-CONTROLLED TIMEPIECE

(75) Inventors: Osamu Onitsuka, Chiba (JP); Kazuyoshi Sugama, Chiba (JP)

(73) Assignee: Seiko Instruments Inc., Chiba (JP)

( * ) Notice: Subject to any disclaimer, the term of this patent is extended or adjusted under 35 U.S.C. 154(b) by 85 days.

(21) Appl. No.: 12/868,433

(22) Filed: Aug. 25, 2010

(65) Prior Publication Data

US 2011/0050046 A1 Mar. 3, 2011

(30) Foreign Application Priority Data

Aug. 25, 2009 (JP) ................................ 2009-194475

(51) Int. Cl.
*H01L 41/053* (2006.01)

(52) U.S. Cl. ....................................... 310/348; 310/370

(58) Field of Classification Search .................. 310/340, 310/344, 348, 370
See application file for complete search history.

(56) References Cited

U.S. PATENT DOCUMENTS

| | | | | |
|---|---|---|---|---|
| 2003/0168943 | A1 * | 9/2003 | Matsuyama et al. | 310/344 |
| 2003/0168944 | A1 * | 9/2003 | Shimizu et al. | 310/344 |

FOREIGN PATENT DOCUMENTS

| | | | |
|---|---|---|---|
| JP | 2006-086585 | A | 3/2006 |
| JP | 2008-022184 | * | 1/2008 |

OTHER PUBLICATIONS

Machine translation of JP2008-022184 generated by the website of the Japanese Patent Office.*

Machine translation of JP2008-022184 generated by the website of the Japanese Patent Office, published Jan. 2008.*

* cited by examiner

*Primary Examiner* — Derek Rosenau

(74) *Attorney, Agent, or Firm* — Brinks Hofer Gilson & Lione

(57) ABSTRACT

Providing a piezoelectric vibrator and a manufacturing method thereof which is capable of achieving gettering in a state where the frequency change of the piezoelectric vibrating reed is suppressed. Providing a piezoelectric vibrator 1 including: a package 9 having a base board 2 and a lid board 3 which are bonded in a superimposed state and a cavity C formed between both boards 2, 3; and a piezoelectric vibrating reed 4 and a gettering material 27 which are accommodated in the same cavity C, wherein a shielding wall 21 is provided in the cavity C so as to shield the piezoelectric vibrating reed 4 from the gettering material 27, and the shielding wall 21 is connected to both the base board 2 and the lid board 3.

10 Claims, 14 Drawing Sheets

PIEZOELECTRIC VIBRATOR, PIEZOELECTRIC VIBRATOR MANUFACTURING METHOD, OSCILLATOR, ELECTRONIC DEVICE, RADIO-CONTROLLED TIMEPIECE

This application claims priority under 35 U.S.C. §119 to Japanese Patent Application No. 2009-194475 filed on Aug. 25, 2009, the entire content of which is hereby incorporated by reference

BACKGROUND OF THE INVENTION

1. Field of the Invention

The present invention relates to a piezoelectric vibrator, a manufacturing method of the piezoelectric vibrator, and an oscillator, an electronic device, and a radio-controlled timepiece.

2. Description of the Related Art

Recently, a piezoelectric vibrator using a piezoelectric vibrating reed made of a piezoelectric material such as quartz has been used in cellular phones and portable information terminals as the time source, the timing source of a control signal, a reference signal source, and the like. As the piezoelectric vibrating reed, for example, a tuning-fork type piezoelectric vibrating reed having a pair of vibrating arms is used.

As the piezoelectric vibrator of this type, an SMD (Surface Mount Device)-type piezoelectric vibrator is known. As an example of the SMD-type piezoelectric vibrator, there is proposed one in which a package is formed by a base board and a lid board, and a piezoelectric vibrating reed is accommodated in a cavity formed inside the package.

Meanwhile, in general piezoelectric vibrators, it is preferable to suppress an equivalent resistance value (effective resistance value Re) to a low value. Since a piezoelectric vibrator having a low equivalent resistance value is capable of vibrating a piezoelectric vibrating reed with a low power, a piezoelectric vibrator having high energy efficiency can be achieved.

As a typical method of suppressing the equivalent resistance value, there is known a method of creating a near-perfect vacuum in the sealed cavity of the piezoelectric vibrating reed so as to decrease a series resonance resistance value (R1) which is proportional to the equivalent resistance value. Moreover, as a method of creating a near-perfect vacuum in the cavity, JP-A-2006-86585 discloses a method (gettering method) of accommodating a gettering material in the cavity and activating the gettering material with laser irradiation from the outside. According to this method, since gas (for example, oxygen) surrounding the gettering material can be absorbed by the activated gettering material, it is possible to create a near-perfect vacuum in the cavity.

In addition, in a typical manufacturing method of the piezoelectric vibrator, a rough tuning step of tuning the frequency of the piezoelectric vibrating reed is performed before the gettering so that the frequency of the piezoelectric vibrating reed falls near a target frequency (nominal frequency). After the series resonance resistance value is adjusted by the gettering, a fine tuning step of tuning the frequency of the piezoelectric vibrating reed is performed so that the frequency of the piezoelectric vibrating reed finally falls within the range of the nominal frequency.

However, the piezoelectric vibrator of the related art has still the following problems.

That is, when the gettering material is activated by laser irradiation or the like, it is highly likely that materials constituting the evaporated gettering material will be scattered to be deposited onto the piezoelectric vibrating reed. When the constituent materials of the gettering material are deposited onto the piezoelectric vibrating reed, there is a problem in that the frequency of the piezoelectric vibrating reed is changed. The frequency change appears differently depending on the position where the gettering material is deposited. For example, in the case of a tuning-fork type piezoelectric vibrating reed, the frequency tends to decrease when the gettering material is deposited onto the tip end of its vibrating arm, and the frequency tends to increase when the gettering material is deposited onto the base end of its vibrating arm.

Moreover, when the frequency of the piezoelectric vibrating reed is changed before and after the gettering step, the frequency having fallen near the nominal frequency during the rough tuning step is changed before the fine tuning step, it may be difficult to make the frequency fall within the range of the nominal frequency by the fine tuning step.

SUMMARY OF THE INVENTION

The present invention has been made in view of the foregoing, and an object of the present invention is to provide a piezoelectric vibrator and a manufacturing method thereof which is capable of achieving gettering in a state where the frequency change of the piezoelectric vibrating reed is suppressed.

The present invention provides the following means in order to solve the problems.

According to an aspect of the present invention, there is provided a piezoelectric vibrator including: a package having a base board and a lid board which are bonded in a superimposed state and a cavity formed between both boards; and a piezoelectric vibrating reed and a gettering material which are accommodated in the same cavity, wherein a shielding wall is provided in the cavity so as to shield the piezoelectric vibrating reed from the gettering material, and the shielding wall is connected to both the base board and the lid board.

A laser irradiation mark may be formed on the gettering material on a side opposite to the piezoelectric vibrating reed with the shielding wall interposed therebetween.

According to this aspect, the shielding wall that shields the piezoelectric vibrating reed from the gettering material is provided in the cavity. Therefore, when the gettering material is activated by laser irradiation on the opposite side of the piezoelectric vibrating reed with the shielding wall interposed therebetween, even if the evaporated gettering material is scattered towards the piezoelectric vibrating reed, the gettering material will be deposited onto the shielding wall. Accordingly, it is possible to suppress the gettering material from being deposited onto the piezoelectric vibrating reed.

In addition, since the shielding wall is connected to both the base board and the lid board, it is possible to securely suppress the gettering material from being deposited onto the piezoelectric vibrating reed compared to the case where a gap is formed between the shielding wall and the base board or the lid board, for example.

Given the above, it is possible to securely suppress the gettering material from being deposited onto the piezoelectric vibrating reed. Thus, gettering can be achieved in a state where the frequency change of the piezoelectric vibrating reed is suppressed.

By achieving the gettering in a state where the frequency change of the piezoelectric vibrating reed is suppressed, the fine tuning of the frequency of the piezoelectric vibrating reed after the gettering is made easy. Thus, it is possible to facilitate the manufacturing process of the piezoelectric vibrator and achieve cost reduction of the piezoelectric vibrator.

At least a part of the cavity may be formed by a recess portion which is formed on the lid board, and the shielding wall may be formed integrally with the lid board so as to extend from a bottom surface of the recess portion towards the base board.

In this case, since the shielding wall is formed integrally with the lid board so as to extend from the bottom surface of the recess portion towards the base board, the recess portion and the shielding wall can be formed at the same time when the piezoelectric vibrator is manufactured. Thus, it is possible to simplify the manufacturing process of the piezoelectric vibrator.

A metal film may be formed on an entire inner surface of the lid board so that a portion of the metal film formed in a contacting portion with the base board serves as a bonding film to be bonded to the base board, and a portion of the metal film formed on a side opposite to the piezoelectric vibrating reed with the shielding wall interposed therebetween serves as the gettering material.

In this case, the portion of the metal film formed in the contacting portion with the base board serves as the bonding film to be bonded to the base board, and the portion of the metal film formed on the opposite side of the piezoelectric vibrating reed with the shielding wall interposed therebetween serves as the gettering material. Therefore, it is possible to simplify the manufacturing process of the piezoelectric vibrator compared to the case of forming the bonding film and the gettering material separately.

The piezoelectric vibrating reed may be a tuning-fork type piezoelectric vibrating reed having a pair of vibrating arms, and the shielding wall may be formed on both outer sides in an array direction of the pair of vibrating arms so as to extend in a longitudinal direction of the vibrating arms.

In this case, since the shielding wall is formed on both outer sides in the array direction of the pair of vibrating arms so as to extend in the longitudinal direction of the vibrating arms, it is possible to secure a large formation area of the gettering material.

A length of the shielding wall in the longitudinal direction of the vibrating arms may be larger than a length of the gettering material in the longitudinal direction of the vibrating arms.

In this case, since the length of the shielding wall in the longitudinal direction of the vibrating arms is larger than the length of the gettering material in the longitudinal direction of the vibrating arms, the evaporated gettering material will not be scattered towards the piezoelectric vibrating reed with the shielding wall interposed therebetween. Even if the evaporated gettering material is scattered towards the piezoelectric vibrating reed while curving its way around the shielding wall, the gettering material will be deposited onto the shielding wall. Therefore, it is possible to suppress the gettering material from being deposited onto the piezoelectric vibrating reed more securely. Thus, the frequency change of the piezoelectric vibrating reed can be suppressed securely.

According to another aspect of the present invention, there is provided a method of manufacturing a piezoelectric vibrator which includes: a package having a base board and a lid board which are bonded in a superimposed state and a cavity formed between both boards; and a piezoelectric vibrating reed and a gettering material which are accommodated in the same cavity, and in which a shielding wall is provided in the cavity so as to shield the piezoelectric vibrating reed from the gettering material, and the shielding wall is connected to both the base board and the lid board, the method including: a gettering step of irradiating the gettering material with a laser beam on a side opposite to the piezoelectric vibrating reed with the shielding wall interposed therebetween and thus activating the gettering material.

According to this aspect, since during the gettering step, the gettering material is irradiated with a laser beam on the opposite side of the piezoelectric vibrating reed with the shielding wall interposed therebetween, thus activating the gettering material, even when the evaporated gettering material is scattered towards the piezoelectric vibrating reed, the gettering material will be deposited onto the shielding wall. Therefore, it is possible to prevent the gettering material from being deposited onto the piezoelectric vibrating reed.

In addition, since the shielding wall is connected to both the base board and the lid board, it is possible to securely suppress the gettering material from being deposited onto the piezoelectric vibrating reed compared to the case where a gap is formed between the shielding wall and the base board or the lid board, for example.

Given the above, it is possible to securely suppress the gettering material from being deposited onto the piezoelectric vibrating reed. Thus, gettering can be achieved in a state where the frequency change of the piezoelectric vibrating reed is suppressed.

By achieving the gettering in a state where the frequency change of the piezoelectric vibrating reed is suppressed, the fine tuning of the frequency of the piezoelectric vibrating reed after the gettering is made easy. Thus, it is possible to facilitate the manufacturing process of the piezoelectric vibrator and achieve cost reduction of the piezoelectric vibrator.

The manufacturing method according to the above aspect may include a recess forming step of forming a recess portion that constitutes at least a part of the cavity on the lid board, and during the recess forming step, the shielding wall may be formed integrally with the lid board so as to extend from a bottom surface of the recess portion towards the base board.

In this case, since during the recess forming step, the shielding wall is formed integrally with the lid board so as to extend from the bottom surface of the recess portion towards the base board, the recess portion and the shielding wall can be formed at the same time. Thus, it is possible to simplify the manufacturing method.

According to a further aspect of the present invention, there is provided an oscillator in which the piezoelectric vibrator according to the above aspect of the present invention is electrically connected to an integrated circuit as an oscillating piece.

According to a still further aspect of the present invention, there is provided an electronic device in which the piezoelectric vibrator according to the above aspect of the present invention is electrically connected to a timer portion.

According to a still further aspect of the present invention, there is provided a radio-controlled timepiece in which the piezoelectric vibrator according to the above aspect of the present invention is electrically connected to a filter portion.

According to the above aspect of the present invention, since they include the low-cost piezoelectric vibrator in which gettering is achieved in a state where the frequency change in the piezoelectric vibrating reed is suppressed, they can be similarly manufactured at a low cost.

According to the aspects of the present invention, the gettering can be achieved in a state where the frequency change of the piezoelectric vibrating reed is suppressed.

DETAILED DESCRIPTION OF THE PREFERRED EMBODIMENTS

First Embodiment

Figure 1:
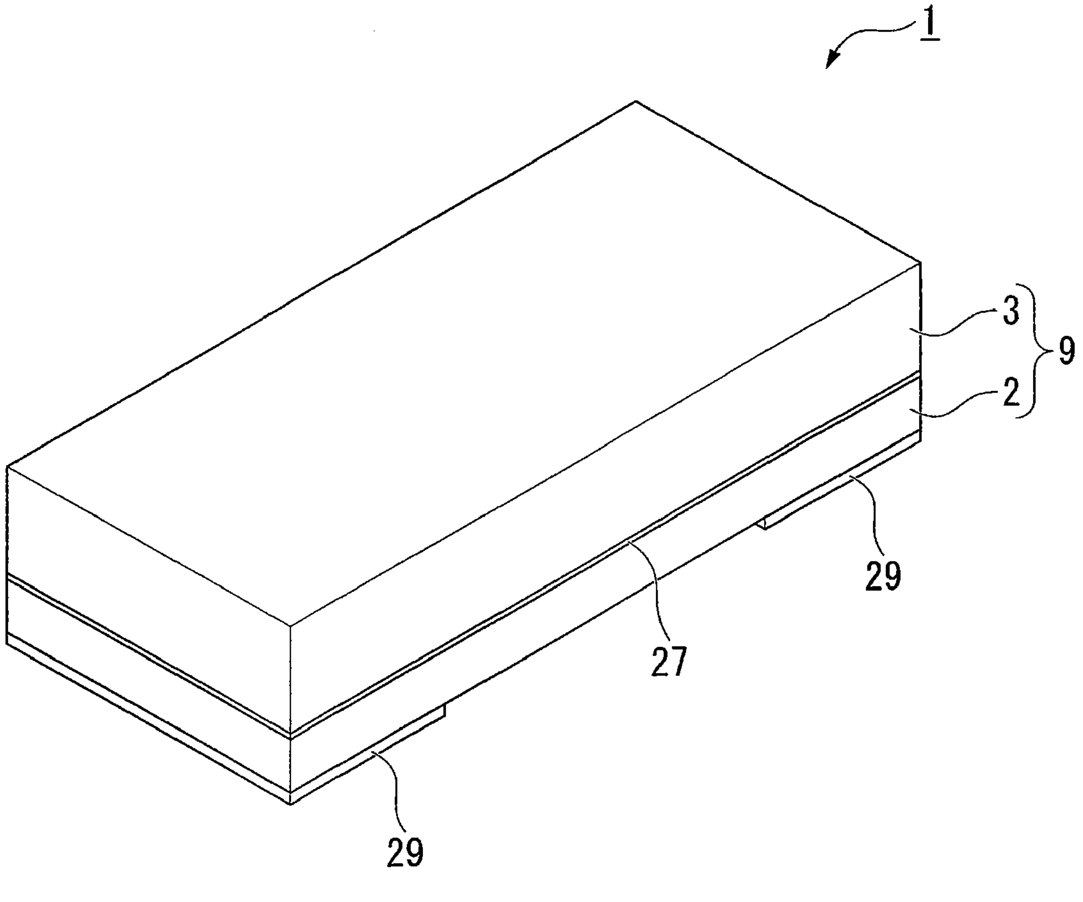
FIG. 1 is a perspective view showing an external appearance of a piezoelectric vibrator according to a first embodiment of the present invention.

Hereinafter, a piezoelectric vibrator according to a first embodiment of the present invention will be described with reference to the drawings.

As shown in FIGS. 1 to 5, a piezoelectric vibrator 1 according to the present embodiment is a SMD-type piezoelectric vibrator including: a package 9 having a base board 2 and a lid board 3 which are bonded in a superimposed state and a cavity C formed between the two boards 2 and 3; and a piezoelectric vibrating reed 4 which is accommodated in the cavity C.

Figure 5:
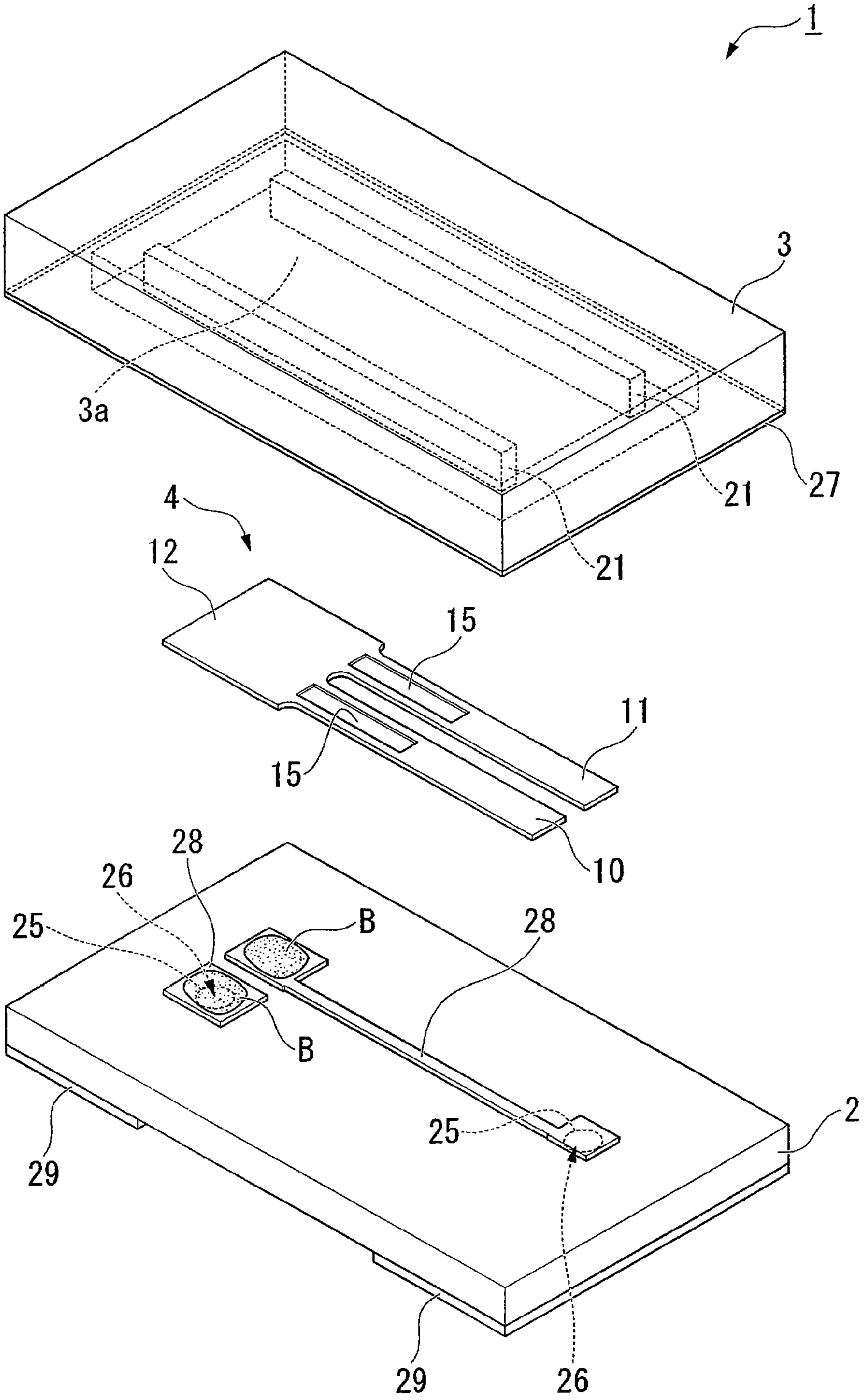
FIG. 5 is an exploded perspective view of the piezoelectric vibrator shown in FIG. 1.

In FIG. 5, for better understanding of the drawings, illustrations of excitation electrodes 13, extraction electrodes 16, mount electrodes 14, and weight metal film 17 are omitted.

Piezoelectric Vibrating Reed

Figure 6:
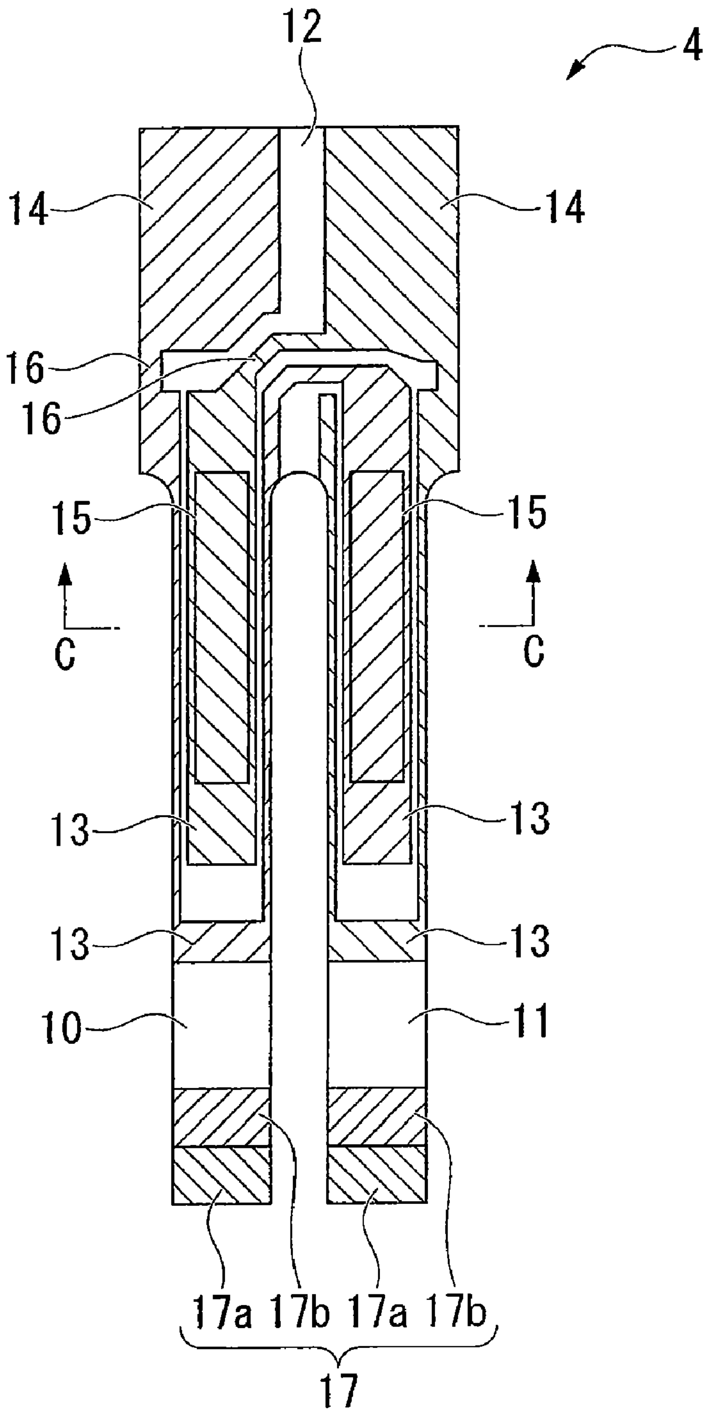
FIG. 6 is a top view of the piezoelectric vibrating reed that constitutes the piezoelectric vibrator shown in FIG. 1.
Figure 7:
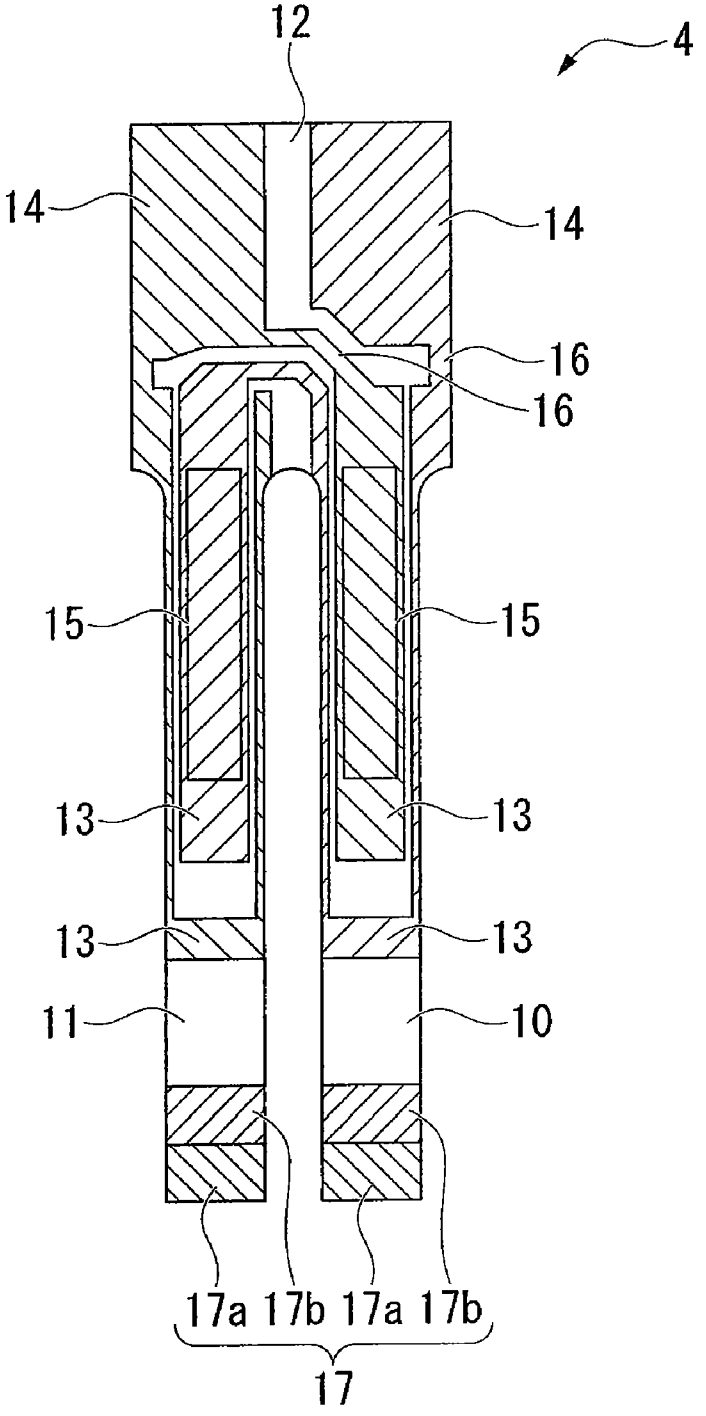
FIG. 7 is a bottom view of the piezoelectric vibrating reed shown in FIG. 6.
Figure 8:
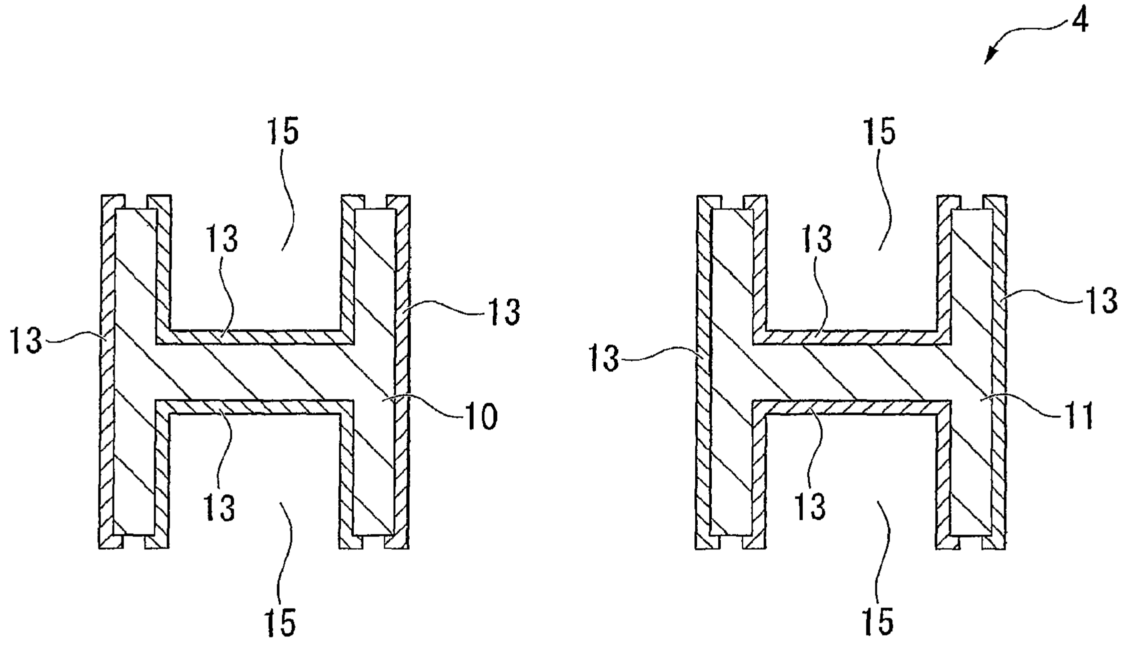
FIG. 8 is a sectional view taken along the line C-C in FIG. 6.

As shown in FIGS. 6 to 8, the piezoelectric vibrating reed 4 is a tuning-fork type vibrating reed which is made of a piezoelectric material such as quartz crystal, lithium tantalate, or lithium niobate and is configured to vibrate when a predetermined voltage is applied thereto.

The piezoelectric vibrating reed 4 includes: a pair of vibrating arms 10 and 11 disposed in parallel to each other; a base portion 12 to which the base end sides of the pair of vibrating arms 10 and 11 are integrally fixed; excitation electrodes 13 which are formed on the outer surfaces of the pair of vibrating arms 10 and 11 so as to allow the pair of vibrating arms 10 and 11 to vibrate; and mount electrodes 14 which are electrically connected to the excitation electrodes 13.

In addition, the piezoelectric vibrating reed 4 according to the present embodiment is provided with groove portions 15 which are formed on both principal surfaces of the pair vibrating arms 10 and 11 along the longitudinal direction of the vibrating arms 10 and 11. The groove portions 15 are formed so as to extend from the base end sides of the vibrating arms 10 and 11 up to approximately the middle portions thereof.

The excitation electrodes 13 are electrodes that allow the pair of vibrating arms 10 and 11 to vibrate at a predetermined resonance frequency in a direction to move closer to or away from each other and are patterned and formed on the outer surfaces of the pair of vibrating arms 10 and 11 in an electrically isolated state. Specifically, as shown in FIG. 8, one excitation electrode 13 is mainly formed on the groove portion 15 of one vibrating arm 10 and both side surfaces of the other vibrating arm 11. On the other hand, the other excitation electrode 13 is mainly formed on both side surfaces of the one vibrating arm 10 and the groove portion 15 of the other vibrating arm 11.

Moreover, as shown in FIGS. 6 and 7, the excitation electrodes 13 are electrically connected to the mount electrodes 14 via the extraction electrodes 16, respectively, on both principal surfaces of the base portion 12. A voltage is applied to the piezoelectric vibrating reed 4 via the mount electrodes 14.

The above-mentioned excitation electrodes 13, mount electrodes 14, and extraction electrodes 16 are formed by coating of a conductive film of chromium (Cr), nickel (Ni), aluminum (Al), and titanium (Ti), for example.

Furthermore, the tip ends of the vibrating arms 10 and 11 are coated with a weight metal film 17 for adjustment of their vibration states (tuning the frequency) in a manner such as to vibrate within a predetermined frequency range. The weight metal film 17 is divided into a rough tuning film 17*a* used for tuning the frequency roughly and a fine tuning film 17*b* used for tuning the frequency finely. By tuning the frequency with the use of the rough tuning film 17*a* and the fine tuning film 17*b*, the frequency of the pair of the vibrating arms 10 and 11 can be set to fall within the range of the nominal frequency of the device.

Figure 2:
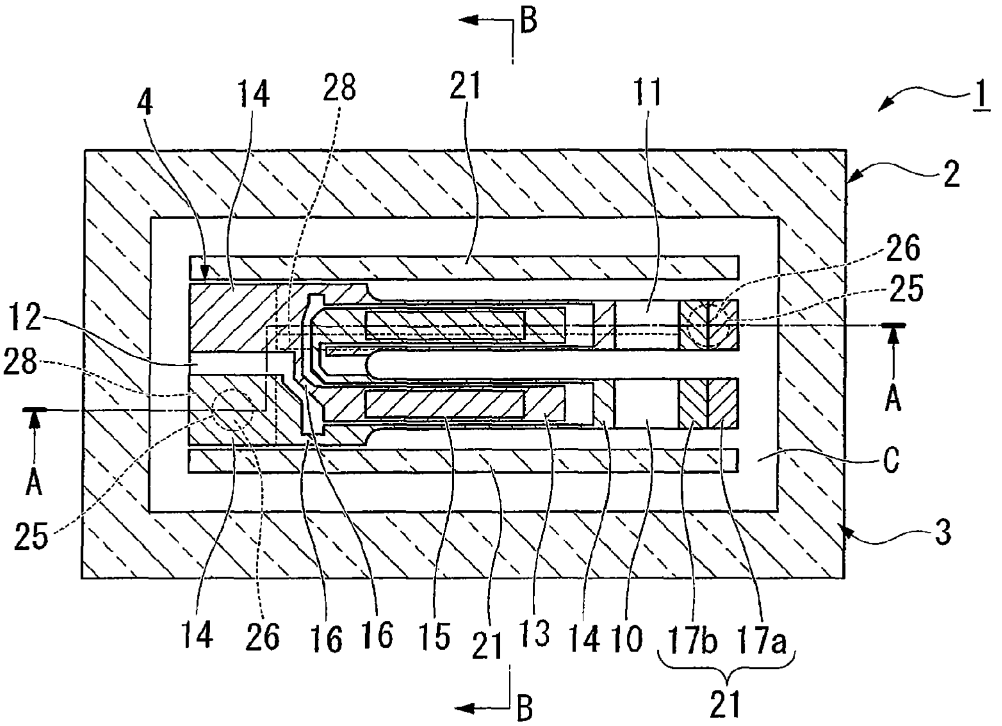
FIG. 2 is a transverse sectional view of the piezoelectric vibrator shown in FIG. 1.
Figure 3:
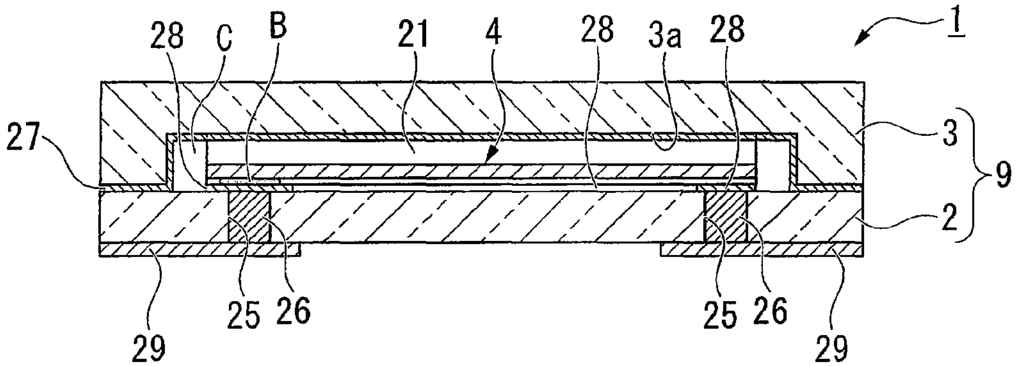
FIG. 3 is a sectional view of the piezoelectric vibrator taken along the line A-A in FIG. 2.

The piezoelectric vibrating reed 4 configured in this way is bump-bonded to the base board 2 by bumps B made of gold or the like as shown in FIGS. 2, 3 and 5. More specifically, bump bonding is achieved in a state where the pair of mount electrodes 14 come into contact with two bumps B formed on lead-out electrodes 28 described later, respectively. In this way, the piezoelectric vibrating reed 4 is supported in a state of being floated from the inner surface (upper surface) of the base board 2, and the mount electrodes 14 and the lead-out electrodes 28 are electrically connected to each other.

Base Board

As shown in FIGS. 1 to 5, the base board 2 is a transparent insulating board made of a glass material, for example, soda-lime glass, and is formed in a board-like form.

As shown in FIGS. 2 and 3, the base board 2 is formed with a pair of through-holes 25 penetrating through the base board 2. The pair of through-holes 25 is formed at both ends of the diagonal line of the cavity C. The pair of through-holes 25 are formed with a pair of penetration electrodes 26 which are formed so as to bury the through-holes 25. The penetration electrodes 26 serve to maintain air-tightness of the inside of the cavity C by completely closing the through-holes 25 and achieve electrical connection between the outer electrodes 29 described later and the lead-out electrodes 28.

Although the present embodiment is described by way of an example of the through-holes 25 which are configured to penetrate straight through the base board 2, as shown in FIG. 3, the present invention is not limited to this example, but for example, the through-holes may be formed in a tapered form whose diameter gradually decreases or increases towards the outer surface (lower surface) of the base board 2. In any case, they only need to penetrate through the base board 2.

As shown in FIG. 5, the inner surface side of the base board 2 is patterned with the pair of lead-out electrodes 28 by a conductive material (for example, aluminum).

The pair of lead-out electrodes 28 are patterned so that one of the pair of penetration electrodes 26 is electrically connected to one mount electrode 14 of the piezoelectric vibrating reed 4, and the other penetration electrode 26 is electrically connected to the other mount electrode 14 of the piezoelectric vibrating reed 4.

The bumps B are formed on the pair of lead-out electrodes 28, and the piezoelectric vibrating reed 4 is mounted via the bumps B. In this way, one mount electrode 14 of the piezoelectric vibrating reed 4 is electrically connected to one penetration electrode 26 via one lead-out electrode 28, and the other mount electrode 14 is electrically connected to the other penetration electrode 26 via the other lead-out electrode 28.

Moreover, the outer surface of the base board 2 is formed with the outer electrodes 29 which are electrically connected to the pair of penetration electrodes 26, respectively, as shown in FIGS. 1, 3, and 5. That is, one outer electrode 29 is electrically connected to one excitation electrode 13 of the piezoelectric vibrating reed 4 via the one penetration electrode 26 and the one lead-out electrode 28. In addition, the other outer electrode 29 is electrically connected to the other excitation electrode 13 of the piezoelectric vibrating reed 4 via the other penetration electrode 26 and the other lead-out electrode 28.

Lid Board

The lid board 3 is a transparent insulating board made of glass material, for example, soda-lime glass, and is formed in a board-like form having a size capable of being superimposed onto the base board 2, as shown in FIGS. 1, 3, 4, and 5.

As shown in FIG. 3, on a side of the lid board 3 close to the base board 2, a rectangular recess portion 3*a* is formed in which the piezoelectric vibrating reed 4 is accommodated. The recess portion 3*a* is a recess portion for a cavity serving as the cavity C that accommodates the piezoelectric vibrating reed 4 when the two boards 2 and 3 are superimposed onto each other. The lid board 3 is anodically bonded to the base board 2 in a state where the recess portion 3*a* faces the base board 2. In the present embodiment, a contacting surface (contacting portion) of the lid board 3 coming into contact with the base board 2 and extending from the outer side over the entire peripheral surface of the recess portion 3*a* is anodically bonded to the base board 2.

Figure 4:
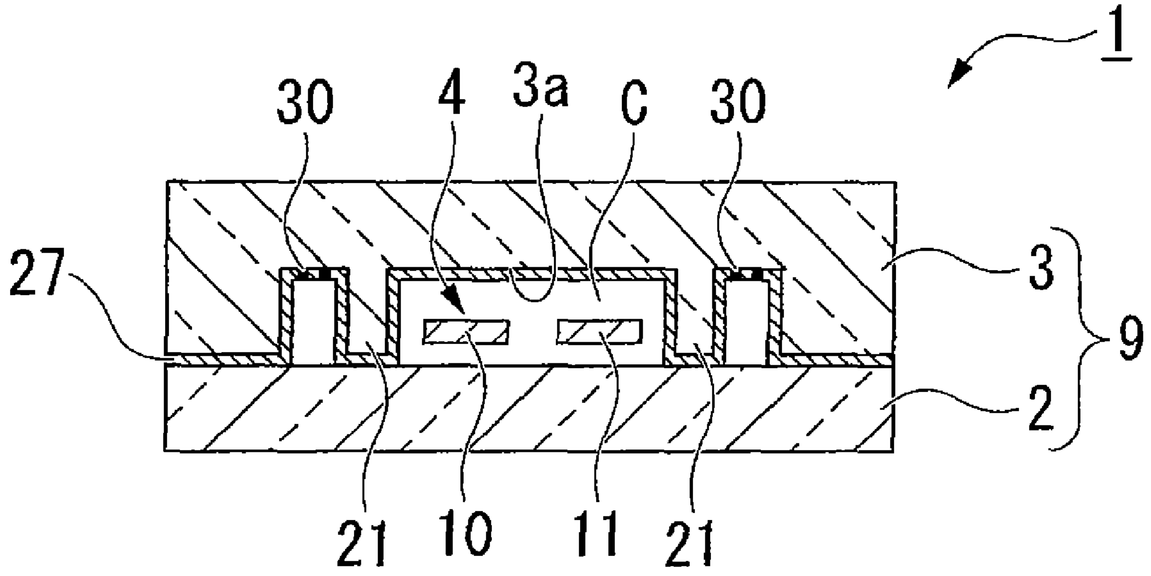
FIG. 4 is a sectional view of the piezoelectric vibrator taken along the line B-B in FIG. 2.

In addition, as shown in FIGS. 2 and 4, on the lid board 3, shielding walls 21 are formed integrally with the lid board 3 so as to extend from the bottom surface of the recess portion 3*a* towards the base board 2. In the present embodiment, the shielding walls 21 are formed on both outer sides in the array direction of the pair of vibrating arms 10 and 11 so as to extend in the longitudinal direction of the vibrating arms 10 and 11.

As shown in FIG. 4, the shielding walls 21 are connected to both the base board 2 and the lid board 3. In the example shown in the figure, the shielding walls 21 extend from the bottom surface of the recess portion 3*a* until the end surfaces thereof come into contact with the base board 2.

In addition, as shown in FIGS. 3 and 4, a metal film 27 is formed on the entire inner surface of the lid board 3, namely on the inner surface of the recess portion 3*a* and the contacting surface. In the present embodiment, the metal film 27 is formed on the entire inner surface of the lid board 3 and the entire surfaces of the shielding walls 21. Moreover, a portion of the metal film 27 formed on the contacting surface with the base board 2 serves as a bonding film to be bonded to the base board 2, and a portion of the metal film 27 formed on the opposite side of the piezoelectric vibrating reed 4 with the shielding walls 21 interposed therebetween serves as a gettering material.

In the present embodiment, the metal film 27 is made of a material (for example, aluminum) which is capable of achieving anodic bonding and absorbing surrounding gas (for example, oxygen) by being activated with laser irradiation.

Moreover, as shown in FIG. 4, the metal film 27 is anodically bonded to the base board 2 at the portion formed on the contacting surface of the lid board 3. In the example shown in the figure, the metal film 27 is also anodically bonded to the base board 2 at the portions formed on the end surfaces of the shielding walls 21.

In addition, as described above, since the metal film 27 is made of such a material capable of absorbing surrounding gas by being activated with laser irradiation, the metal film 27 formed in the cavity C serves as a gettering material that absorbs gas in the cavity C by being activated with laser irradiation.

In addition, in the present embodiment, as shown in FIG. 4, laser irradiation marks 30 are formed on the metal film 27 on the opposite side of the piezoelectric vibrating reed 4 with the shielding walls 21 interposed therebetween. The laser irradiation marks 30 are formed when the metal film 27 is removed by laser irradiation during a gettering step described later. For example, when one point of the metal film 27 is irradiated (point-irradiated) with a laser beam, the laser irradiation mark 30 is formed in a bowl shape. Moreover, when the point-irradiation is repeated by scanning the laser beam at a short distance, the laser irradiation marks 30 are formed in a groove shape.

In the piezoelectric vibrator 1 configured in this manner, the piezoelectric vibrating reed 4 and the gettering material (the metal film 27 formed in the cavity C) are accommodated in the same cavity C, and the shielding walls 21 shield the piezoelectric vibrating reed 4 from the gettering material (the metal film 27 formed on the opposite side of the piezoelectric vibrating reed 4 with the shielding walls 21 interposed therebetween).

When the piezoelectric vibrator 1 configured in this manner is operated, a predetermined drive voltage is applied to the outer electrodes 29 formed on the base board 2. In this way, a current can be made to flow to the excitation electrodes 13 of the piezoelectric vibrating reed 4, and the pair of vibrating arms 10 and 11 are allowed to vibrate at a predetermined frequency in a direction to move closer to or away from each other. This vibration of the pair of vibrating arms 10 and 11 can be used as the time source, the timing source of a control signal, the reference signal source, and the like.

Manufacturing Method of Piezoelectric Vibrator

Figure 9:
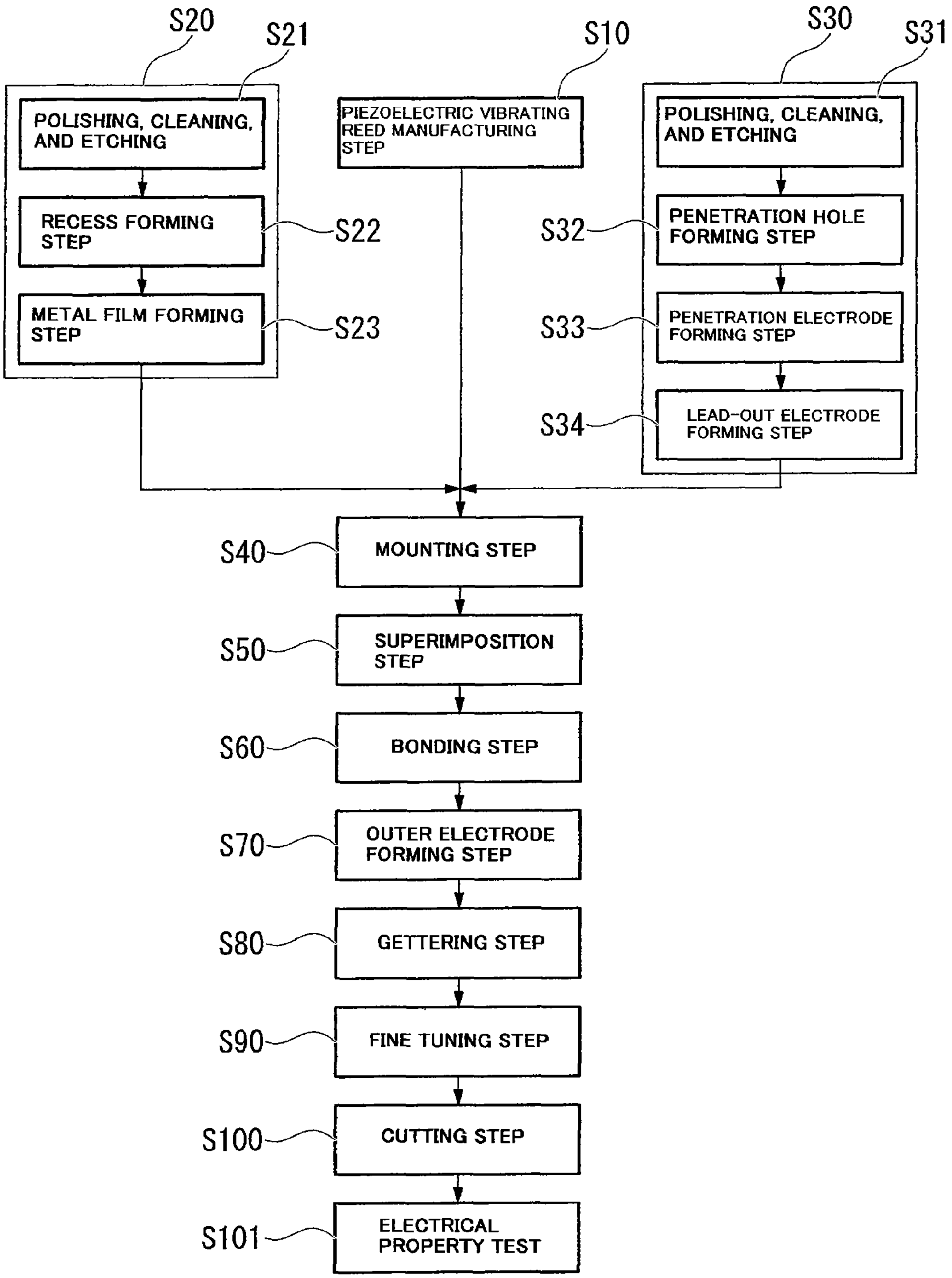
FIG. 9 is a flowchart showing the flow of the manufacturing process of the piezoelectric vibrator shown in FIG. 1.
Figure 10:
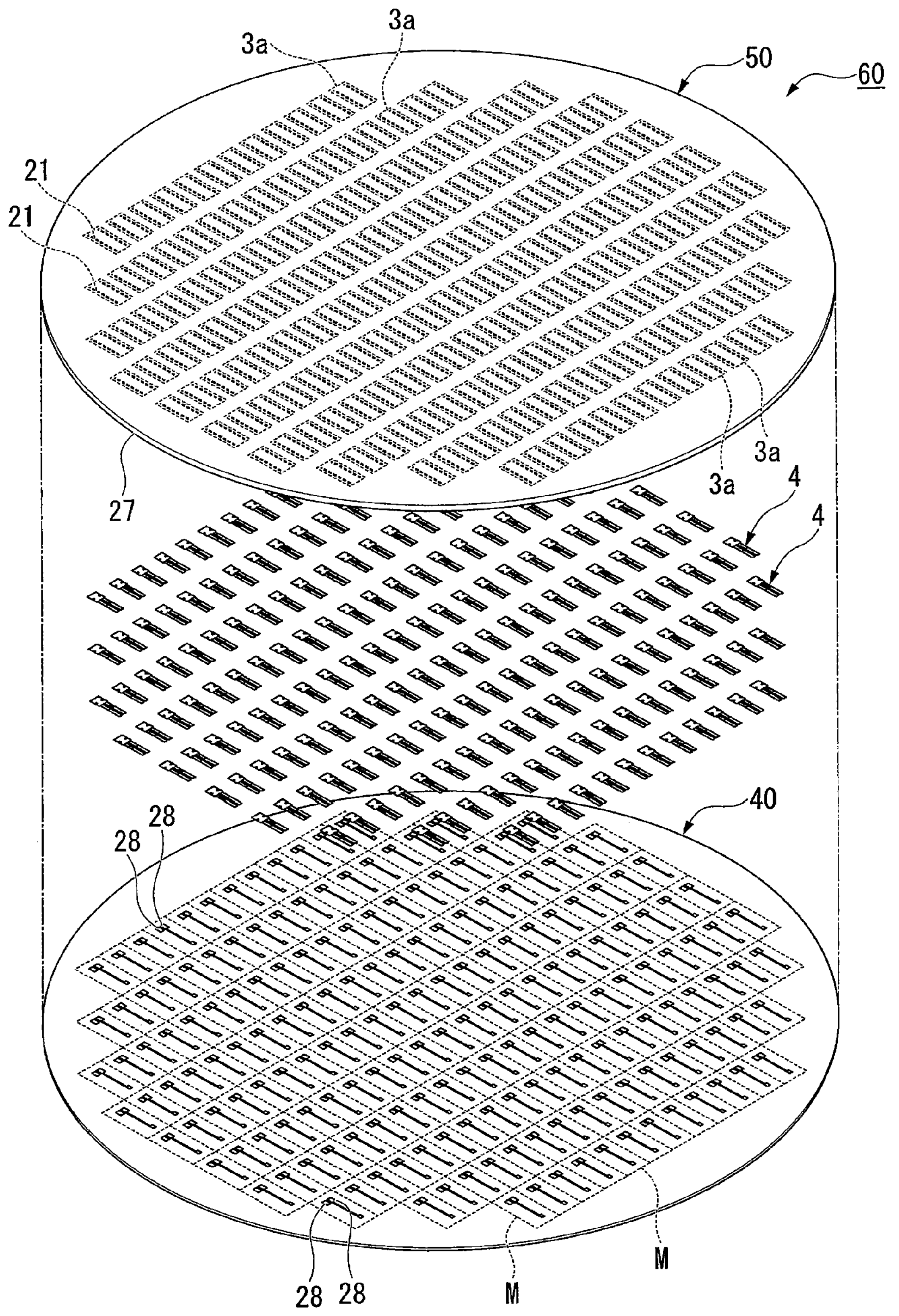
FIG. 10 is a view showing one step of the manufacturing process of the piezoelectric vibrator in accordance with the flowchart shown in FIG. 9, and is also an exploded perspective view of a wafer assembly in which the base board wafer and the lid board wafer are anodically bonded with the piezoelectric vibrating reed accommodated in a cavity.

Next, a method for manufacturing the above-described piezoelectric vibrator 1 will be described with reference to FIGS. 9 and 10. The dotted line M shown in FIG. 10 is a cutting line along which a cutting step performed later is achieved. Although in the present embodiment, a plurality of piezoelectric vibrators 1 is manufactured at a time using wafer-shaped boards, the present invention is not limited to this. For example, only one piezoelectric vibrator may be manufactured at a time using boards which are processed to comply with the outer dimensions of the base board 2 and the lid board 3 in advance.

First, a piezoelectric vibrating reed manufacturing step is performed to manufacture the piezoelectric vibrating reed 4 shown in FIGS. 6 to 8 (S10). Specifically, first, a rough quartz crystal lambert is sliced at a predetermined angle to obtain a wafer having a constant thickness. Subsequently, the wafer is subjected to crude processing by lapping, and an affected layer is removed by etching. Then, the wafer is subjected to mirror processing such as polishing to obtain a wafer having a predetermined thickness. Subsequently, the wafer is subjected to appropriate processing such as washing, and the wafer is patterned so as to have the outer shape of the piezoelectric vibrating reed 4 by a photolithography technique. Moreover, a metal film is formed and patterned on the wafer, thus forming the excitation electrodes 13, the extraction electrodes 16, the mount electrodes 14, and the weight metal film 17. In this way, a plurality of piezoelectric vibrating reeds 4 can be manufactured.

Moreover, after the piezoelectric vibrating reed 4 is manufactured, a step (rough tuning step) of roughly tuning a resonance frequency is performed. This rough tuning is achieved by irradiating the rough tuning film 17*a* of the weight metal film 17 with a laser beam to evaporate in part the rough tuning film 17*a*, thus changing a weight thereof. In this way, the frequency (resonance frequency) of the piezoelectric vibrating reed 4 can be made to fall near a target frequency (nominal frequency). A fine tuning step of adjusting the frequency of the piezoelectric vibrating reed 4 more accurately so that the frequency eventually falls within the range of the nominal frequency is performed after a mounting step is performed. This fine tuning step will be described later.

Subsequently, as shown in FIG. 10, a first wafer manufacturing step is performed where the lid board wafer 50 later serving as the lid board 3 is manufactured up to a stage immediately before anodic bonding is achieved (S20).

In this step, first, a disk-shaped lid board wafer 50 is formed by polishing a soda-lime glass to a predetermined thickness, cleaning the polished glass, and removing an affected uppermost layer by etching or the like (S21). Subsequently, a recess forming step is performed where a plurality of recess portions 3*a* to be used as a cavity C is formed in a matrix form on a side of the lid board wafer 50 close to the base board wafer 40 (S22).

Here, in the present embodiment, in this recess forming step, the shielding walls 21 are formed integrally with the lid board 3 so as to extend from the bottom surface of the recess portion 3*a* towards the base board 2. At that time, by etching the lid board wafer 50, the recess portion 3*a* and the shielding walls 21 may be formed at the same time. Moreover, by pressing the lid board wafer 50 from above and below using a jig while applying heat thereto, the recess portion 3*a* and the shielding walls 21 may be formed at the same time. Furthermore, by screen-printing glass paste at necessary positions on the lid board wafer 50, the recess portion 3*a* and the shielding walls 21 may be formed at the same time. The formation method is not particularly limited.

Subsequently, a metal film forming step is performed where a metal film 27 is formed over the entire inner surface of the lid board wafer 50 where the recess portion 3*a* is formed (S23). At that time, the metal film 27 is formed, for example, by deposition, sputtering, and the like.

The first wafer manufacturing step ends at this point in time.

Subsequently, as shown in FIG. 10, at the same or different time as the first wafer manufacturing step, a second wafer manufacturing step is performed where a base board wafer 40 later serving as the base board 2 is manufactured up to a stage immediately before anodic bonding is achieved (S30).

In this step, first, a disk-shaped base board wafer 40 is formed by polishing a soda-lime glass to a predetermined thickness, cleaning the polished glass, and removing an affected uppermost layer by etching or the like (S31).

Subsequently, as shown in FIG. 5, a penetration hole forming step is performed where a plurality of pairs of through-holes 25 is formed so as to penetrate through the base board wafer 40 (S32). Subsequently, a penetration electrode forming step is performed where the through-holes 25 are buried with a conductor not shown to form a pair of penetration electrodes 26 (S33). Subsequently, a lead-out electrode forming step is performed where a conductive material is patterned on the inner surface of the base board wafer 40 so as to form a plurality of lead-out electrodes 28 which are electrically connected to each pair of the penetration electrodes 26 (S34).

The second wafer manufacturing step ends at this point in time.

Subsequently, a mounting step is performed where a plurality of manufactured piezoelectric vibrating reeds 4 is bump-bonded to the inner surface of the base board wafer 40 with the lead-out electrodes 28 disposed therebetween (S40). First, bumps B made of gold or the like are formed on the pair of lead-out electrodes 28. The base portion 12 of the piezoelectric vibrating reed 4 is placed on the bumps B, and the piezoelectric vibrating reed 4 is pressed against the bumps B while heating the bumps B to a predetermined temperature. In this way, the piezoelectric vibrating reed 4 is mechanically supported by the bumps B to be floated from the inner surface of the base board wafer 40, and the mount electrodes 14 are electrically connected to the lead-out electrodes 28.

After the piezoelectric vibrating reed 4 is mounted, a superimposition step is performed where the lid board wafer 50 is superimposed onto the base board wafer 40 as shown in FIG. 10 (S50). Specifically, both wafers 40 and 50 are aligned at a correct position using reference marks or the like not shown in the figure as indices. In this way, the mounted piezoelectric vibrating reed 4 is accommodated in the cavity C which is formed between both the base board wafer 40 and the lid board wafer 50. In addition, the end surfaces (the metal film 27) of the shielding walls 21 come into contact with the base board wafer 40, and the shielding walls 21 are connected to both wafers 40 and 50.

After the superimposition step is performed, a bonding step is performed where the two superimposed wafers 40 and 50 are inserted into an anodic bonding machine not shown to achieve anodic bonding under a predetermined temperature atmosphere with application of a predetermined voltage (S60). Specifically, a predetermined voltage is applied between the metal film 27 and the base board wafer 40. Then, an electrochemical reaction occurs at an interface between the metal film 27 and the base board wafer 40, whereby the contacting surface of the lid board wafer 50, the end surfaces of the shielding walls 21, and the base board wafer 40 are closely adhered tightly and anodically bonded. In this way, a wafer assembly 60 can be obtained as shown in FIG. 10 in which the lid board wafer 50, the shielding walls 21, and the base board wafer 40 are bonded to each other, and the piezoelectric vibrating reed 4 is sealed in the cavity C.

After the anodic bonding is completed, an outer electrode forming step is performed where a conductive material is patterned onto the outer surface of the base board wafer 40 so as to form a plurality of pairs of outer electrodes 29 (S70). By this step, the piezoelectric vibrating reed 4 which is sealed in the cavity C can be operated using the outer electrodes 29.

Subsequently, a gettering step is performed to improve the degree of vacuum in the cavity C. Here, in the present embodiment, during the gettering step, the metal film 27 is activated by irradiating the metal film 27 with a laser beam on a side opposite to the piezoelectric vibrating reed 4 with the shielding walls 21 interposed therebetween. Specifically, the metal film 27 is activated by irradiating laser beams several times from the side of the base board wafer 40. By doing so, since the activated metal film 27 is evaporated to absorb gas (for example, oxygen) in the cavity C, the degree of vacuum in the cavity C is improved. As a result, it is possible to adjust the series resonance resistance value (R1) of the piezoelectric vibrating reed 4. At this time, as shown in FIG. 4, laser irradiation marks 30 are formed on portions of the metal film 27 irradiated with the laser beam.

Here, as shown in FIG. 4, since the shielding walls 21 are provided in the cavity C, even when materials constituting the evaporated metal film 27 are scattered towards the piezoelectric vibrating reed 4, the materials will be deposited onto the shielding walls 21. Therefore, it is possible to prevent the constituent materials of the metal film 27 from being deposited onto the piezoelectric vibrating reed 4. In addition, since the shielding walls 21 are connected to both the base board wafer 40 and the lid board wafer 50, it is possible to securely suppress the constituent materials of the metal film 27 from being deposited onto the piezoelectric vibrating reed 4 compared to the case where a gap is formed between the shielding walls 21 and the base board wafer 40 or the lid board wafer 50, for example.

Subsequently, a fine tuning step is performed on the wafer assembly 60 shown in FIG. 10 where the frequencies of the individual piezoelectric vibrating reeds 4 sealed in the cavities C are tuned finely to fall within a predetermined range (S90). Specifically, a voltage is applied to the outer electrodes 29, thus allowing the piezoelectric vibrating reeds 4 to vibrate. A laser beam is irradiated, for example, onto the lid board wafer 50 from the outer side while measuring the vibration frequencies to evaporate the fine tuning film 17*b* of the weight metal film 17. By doing so, since the weight on the tip ends of the pair of vibrating arms 10 and 11 changes, the frequency of the piezoelectric vibrating reed 4 can be finely tuned so as to fall within a predetermined range of the nominal frequency.

After the fine tuning of the frequency is completed, a cutting step is performed where the wafer assembly 60 shown in FIG. 10 is cut along the cutting line M to obtain small fragments (S100). As a result, a plurality of SMD-type piezoelectric vibrators 1 shown in FIG. 1, in which the piezoelectric vibrating reed 4 is sealed in the cavity C formed between the base board 2 and the lid board 3 being anodically bonded together, can be manufactured at a time.

The fine tuning step (S90) may be performed after performing the cutting step (S100) to obtain the individual fragments of the piezoelectric vibrators 1. However, as described above, by performing the fine tuning step (S90) earlier, since the fine tuning step can be performed on the wafer assembly 60, it is possible to perform the fine tuning on the plurality of piezoelectric vibrators 1 more efficiently. Therefore, it is desirable because throughput can be increased.

Subsequently, an inner electrical property test is conducted (S110). That is, the resonance frequency, resonance resistance value, drive level properties (the excitation power dependence of the resonance frequency and the resonance resistance value), and the like of the piezoelectric vibrating reed 4 are measured and checked. Moreover, the insulation resistance properties and the like are checked as well. Finally, an external appearance test of the piezoelectric vibrator 1 is conducted to check the dimensions, the quality, and the like. In this way, the manufacturing of the piezoelectric vibrator 1 ends.

As described above, according to the piezoelectric vibrator 1 according to the present embodiment, it is possible to securely suppress the constituent materials of the metal film 27 from being deposited onto the piezoelectric vibrating reed 4 during the gettering step. Thus, gettering can be achieved in a state where the frequency change of the piezoelectric vibrating reed 4 is suppressed.

In this way, since the frequency of the piezoelectric vibrating reed 4 can be easily adjusted to fall within the range of the nominal frequency, it is possible to facilitate the manufacturing process of the piezoelectric vibrator 1 and achieve cost reduction of the piezoelectric vibrator 1.

In addition, since the shielding walls 21 are formed integrally with the lid board 3 so as to extend from the bottom surface of the recess portion 3*a* towards the base board 2, the recess portion 3*a* and the shielding walls 21 can be formed at the same time when the piezoelectric vibrator 1 is manufactured. Thus, it is possible to simplify the manufacturing process of the piezoelectric vibrator 1.

In this case, the portion of the metal film 27 formed in the contacting portion with the base board 2 serves as the bonding film to be bonded to the base board 2, and the portion of the metal film 27 formed on the opposite side of the piezoelectric vibrating reed 4 with the shielding walls 21 interposed therebetween serves as the gettering material. Therefore, it is possible to simplify the manufacturing process of the piezoelectric vibrator 1 compared to the case of forming the bonding film and the gettering material separately.

The present embodiment has been described that during the gettering step, the laser beam is irradiated onto only the metal film 27 positioned on the opposite side of the piezoelectric vibrating reed 4 with the shielding walls 21 interposed therebetween. However, after the laser irradiation onto the metal film 27 positioned on the opposite side of the piezoelectric vibrating reed 4 with the shielding walls 21 interposed therebetween, the other portions of the metal film 27 positioned in the cavity C may be irradiated with a laser beam. In this case, the degree of vacuum in the cavity C can be improved further. As a result, the laser irradiation marks 30 are also formed on the other portions of the metal film 27 other than the portion positioned on the opposite side of the piezoelectric vibrating reed 4 with the shielding walls 21 interposed therebetween.

Second Embodiment

Next, a piezoelectric vibrator according to a second embodiment of the present invention will be described with reference to FIGS. 11 to 13. In the second embodiment, the same constituent elements as those in the first embodiment will be denoted by the same reference numerals, and description thereof will be omitted and only the points of difference will be described.

Figure 11:
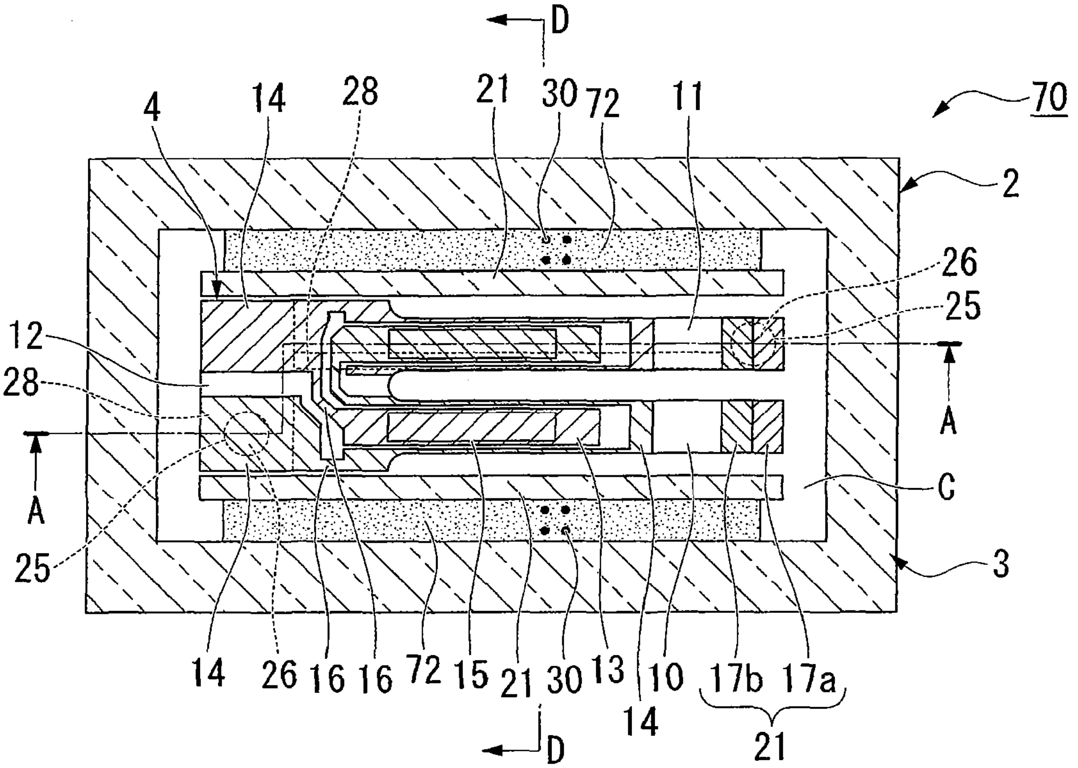
FIG. 11 is a transverse sectional view of a piezoelectric vibrator according to a second embodiment of the present invention.
Figure 12:
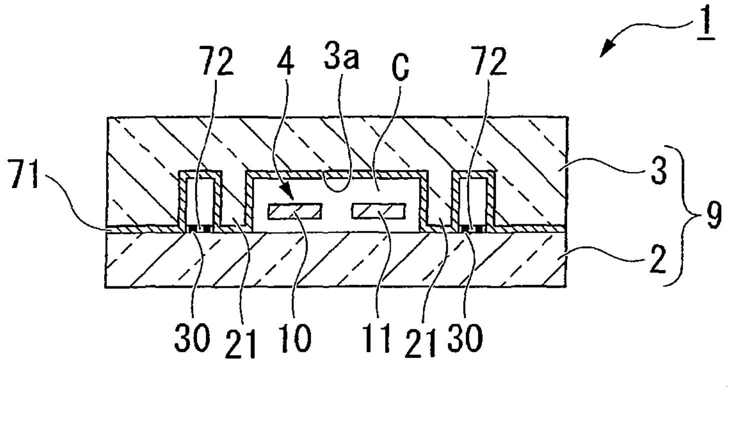
FIG. 12 is a sectional view taken along the line D-D in FIG. 11.
Figure 13:
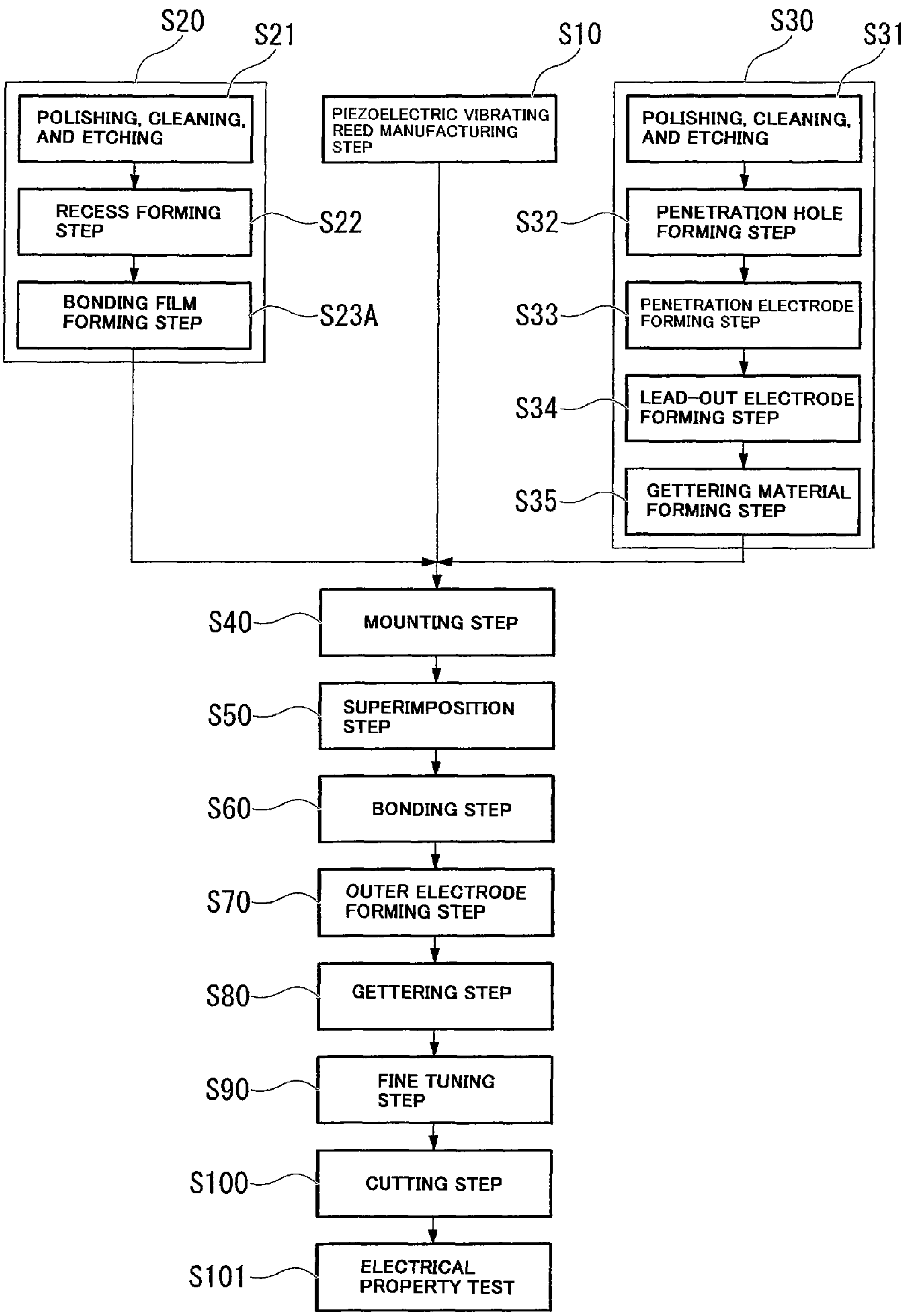
FIG. 13 is a flowchart showing the flow of the manufacturing process of the piezoelectric vibrator shown in FIG. 11.

As shown in FIGS. 11 and 12, in a piezoelectric vibrator 70 of the present embodiment, instead of the metal film 27, a bonding film 71 made of a non-metallic material (for example, silicon) is formed on the entire inner surface of the lid board 3. The bonding film 71 is anodically bonded to the base board 2 at portions formed on the contacting surface of the lid board 3 and portions formed on the end surfaces of the shielding walls 21.

Moreover, as shown in FIG. 11, gettering materials 72 are formed in the cavity C. The gettering materials 72 are provided on both outer sides in the array direction of the pair of vibrating arms 10 and 11 so as to extend in the longitudinal direction of the vibrating arms 10 and 11. In the example shown in the figure, the gettering materials 72 are formed on portions of the inner surface of the base board 2 adjacent to the contacting portion with the lid board 3.

As shown in FIG. 12, the shielding walls 21 shield the piezoelectric vibrating reed 4 from the gettering materials 72. The shielding walls 21 are arranged between the gettering materials 72 and the piezoelectric vibrating reed 4 as viewed in a top view from the normal direction of the lid board 3.

Moreover, the length of the shielding walls 21 in the longitudinal direction of the vibrating arms 10 and 11 is larger than the length of the gettering materials 72 in the longitudinal direction of the vibrating arms 10 and 11. Furthermore, the gettering materials 72 are arranged on the inner side of the shielding walls 21 in the longitudinal direction. That is to say, over the entire length thereof, the gettering materials 72 are formed in the cavity C to be positioned on the opposite side of the piezoelectric vibrating reed 4 with the shielding walls 21 interposed therebetween.

The laser irradiation marks 30 are also formed on the gettering materials 72.

Next, a method for manufacturing the piezoelectric vibrator 70 will be described with reference to FIG. 13.

In the present embodiment, instead of the metal film forming step (S23) in the first wafer manufacturing step (S20), a bonding film forming step is performed where a bonding film 71 is formed on the entire inner surface of the lid board wafer 50 on which the recess portion 3*a* is formed (S23A).

Moreover, in the second wafer manufacturing step (S30), a gettering material forming step is performed where gettering materials 72 are formed (S35). The lead-out electrode forming step (S34) and the gettering material forming step (S35) may precede each other. Moreover, the steps may be performed at the same time if the lead-out electrodes 28 and the gettering materials 72 are formed of the same materials.

In the gettering step (S80), the gettering materials 72 are irradiated with a laser beam to activate the gettering materials 72. By doing so, since the activated gettering materials 72 are evaporated to absorb gas (for example, oxygen) in the cavity C, the degree of vacuum in the cavity C is improved. As a result, it is possible to adjust the series resonance resistance value (R1) of the piezoelectric vibrating reed 4. At this time, laser irradiation marks 30 are formed on portions of the gettering materials 72 irradiated with the laser beam.

Here, since the shielding walls 21 are provided in the cavity C, even when the evaporated gettering materials 72 are scattered towards the piezoelectric vibrating reed 4, the gettering materials 72 will be deposited onto the shielding walls 21. Therefore, it is possible to prevent the gettering materials 72 from being deposited onto the piezoelectric vibrating reed 4. In addition, since the shielding walls 21 are connected to both the base board wafer 40 and the lid board wafer 50, it is possible to securely suppress the gettering materials 72 from being deposited onto the piezoelectric vibrating reed 4 compared to the case where a gap is formed between the shielding walls 21 and the base board wafer 40 or the lid board wafer 50, for example.

As described above, according to the piezoelectric vibrator 70 according to the present embodiment, it is possible to securely suppress the gettering materials 72 from being deposited onto the piezoelectric vibrating reed 4 during the gettering step. Thus, gettering can be achieved in a state where the frequency change of the piezoelectric vibrating reed 4 is suppressed.

In this way, since the frequency of the piezoelectric vibrating reed 4 can be easily adjusted to fall within the range of the nominal frequency, it is possible to facilitate the manufacturing process of the piezoelectric vibrator 70 and achieve cost reduction of the piezoelectric vibrator 70.

Moreover, since the shielding walls 21 are formed on both outer sides in the array direction of the pair of vibrating arms 10 and 11 so as to extend in the longitudinal direction of the vibrating arms 10 and 11, it is possible to secure a large formation area of the gettering materials 72.

In this case, since the length of the shielding walls 21 in the longitudinal direction of the vibrating arms 10 and 11 is larger than the length of the gettering materials 72 in the longitudinal direction of the vibrating arms 10 and 11, the evaporated gettering materials will not be scattered towards the piezoelectric vibrating reed 4 with the shielding walls 21 interposed therebetween. Even if the evaporated gettering materials 72 are scattered towards the piezoelectric vibrating reed 4 while curving its way around the shielding walls 21, the gettering materials 72 will be deposited onto the shielding walls 21. Therefore, it is possible to suppress the gettering materials 72 from being deposited onto the piezoelectric vibrating reed 4 more securely. Thus, the frequency change of the piezoelectric vibrating reed 4 can be suppressed securely.

Although in the present embodiment, the length of the shielding walls 21 in the longitudinal direction of the vibrating arms 10 and 11 is larger than the length of the gettering materials 72 in the longitudinal direction of the vibrating arms 10 and 11, the present invention is not limited to this, and the length of the shielding walls 21 may be smaller than the length of the gettering materials 72.

In this case, in the gettering step, by irradiating the laser beam onto the gettering materials 72 positioned on the opposite side of the piezoelectric vibrating reed 4 with the shielding walls 21 interposed therebetween, it is possible to cause the scattered gettering materials 72 to be deposited onto the shielding walls 21. As a result, the laser irradiation marks 30 are also formed on the gettering materials 72 positioned on the opposite side of the piezoelectric vibrating reed 4 with the shielding walls 21 interposed therebetween.

Moreover, in this case, after irradiating the laser beam onto the gettering materials 72 positioned on the opposite side of the piezoelectric vibrating reed 4 with the shielding walls 21 interposed therebetween, by irradiating the laser beam further onto the gettering materials 72 positioned on the outer side of the shielding walls 21 in the longitudinal direction, the degree of vacuum in the cavity C can be improved further.

In addition, although in the present embodiment, the bonding film 71 is made of non-metallic materials, the bonding film 71 may be made of metallic materials.

Oscillator

Next, an oscillator according to an embodiment of the present invention will be described with reference FIG. 14.

In the following embodiments, the piezoelectric vibrator 1 according to the first embodiment is used as the piezoelectric vibrator. However, the same operational effect can be obtained with the piezoelectric vibrator 70 according to the second embodiment.

Figure 14:
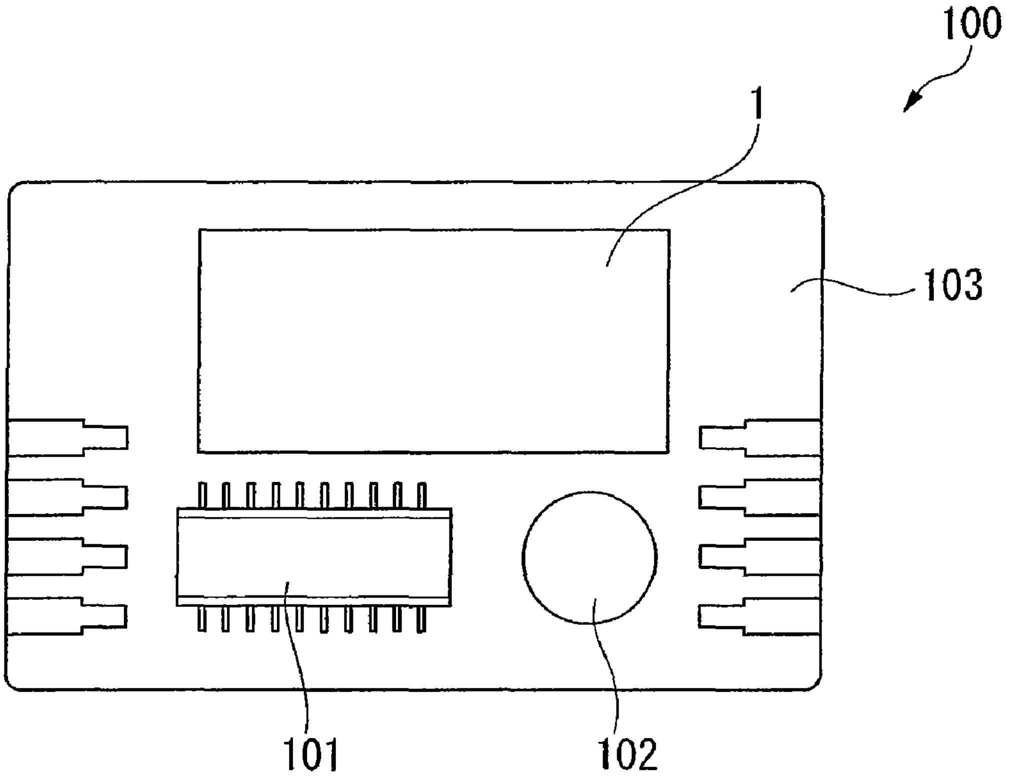
FIG. 14 is a view showing the configuration of an oscillator according to an embodiment of the present invention.

As shown in FIG. 14, an oscillator 100 of the present embodiment is one in which the piezoelectric vibrator 1 is configured as an oscillating piece that is electrically connected to an integrated circuit 101. The oscillator 100 includes a board 103 on which an electronic component 102 such as a capacitor is mounted. The integrated circuit 101 for the oscillator is mounted on the board 103, and the piezoelectric vibrating reed 4 of the piezoelectric vibrator 1 is mounted in the vicinity of the integrated circuit 101. The electronic component 102, integrated circuit 101, and piezoelectric vibrator 1 are electrically connected by a wiring pattern which is not shown. It should be noted that these components are molded by resin which is not shown.

In the oscillator 100 configured in this manner, the piezoelectric vibrating reed 4 in the piezoelectric vibrator 1 vibrates when a voltage is applied to the piezoelectric vibrator 1. This vibration is converted to an electrical signal by the piezoelectric properties of the piezoelectric vibrating reed 4 and is then input to the integrated circuit 101 as the electrical signal. The input electrical signal is subjected to various kinds of processing by the integrated circuit 101 and is then output as a frequency signal. In this way, the piezoelectric vibrator 1 functions as an oscillating piece.

By selectively setting the configuration of the integrated circuit 101, for example, an RTC (Real Time Timepiece) module, according to the demands, it is possible to add a function of controlling the date or time for operating the device or an external device or providing the time or calendar other than a single-function oscillator for a timepiece.

According to the present embodiment, since the oscillator 100 includes the piezoelectric vibrator 1 which can be manufactured at a low cost, it is possible to reduce the cost of the oscillator 100.

Electronic Device

Figure 15:
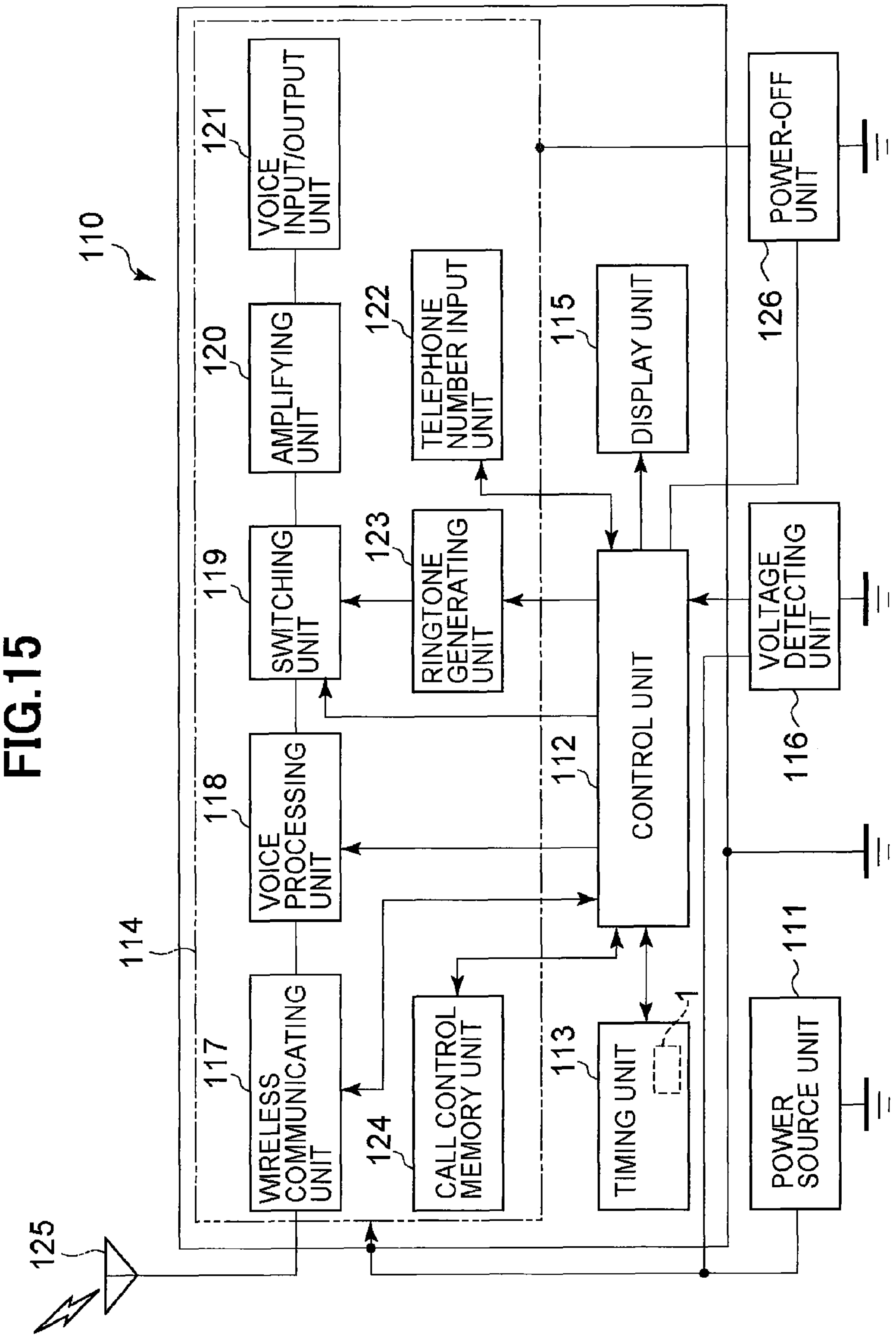
FIG. 15 is a view showing the configuration of an electronic device according to an embodiment of the present invention.

Next, an electronic device according to an embodiment of the present invention will be described with reference to FIG. 15. The present embodiment will be described by way of the example of a portable information device 110 having the piezoelectric vibrator 1 as an example of the electronic device. First, the portable information terminal 110 of the present embodiment is represented, for example, by a cellular phone and is one that develops and improves a wristwatch of the related art. The portable information device 110 looks like a wristwatch in external appearance and is provided with a liquid crystal display at a portion corresponding to the dial pad and is capable of displaying the current time or the like on the screen. When the portable information device 110 is used as a communication tool, the user removes it from the wrist and performs communication as with a cellular phone of the related art using the internal speaker and microphone on the inner side of its strap. However, the portable information device is remarkably small and light compared with the cellular phone of the related art.

Next, the configuration of the portable information device 110 of the present embodiment will be described. As shown in FIG. 15, the portable information device 110 includes the piezoelectric vibrator 1 and a power supply portion 111 for supplying power. The power supply portion 111 is formed, for example, of a lithium secondary battery. The power supply portion 111 is connected in parallel to a control portion 112 that performs various kinds of control, a timer portion 113 that measures the time or the like, a communication portion 114 that performs communication with the outside, a display portion 115 that displays various kinds of information, and a voltage detection portion 116 that detects voltages at the respective function portions. The power supply portion 111 supplies power to the respective functional portions.

The control portion 112 controls the respective function portions so as to control operations of the overall system, such as operations to transmit and receive audio data and operations to count and display the current time. The control portion 112 includes a ROM in which a program is written in advance, a CPU that reads out and runs the program written to the ROM, a RAM used as a work area of the CPU, and the like.

The timer portion 113 includes an integrated circuit enclosing an oscillation circuit, a register circuit, a time counting circuit, and an interface circuit, and the like as well as the piezoelectric vibrator 1. When a voltage is applied to the piezoelectric vibrator 1, the piezoelectric vibrating reed 4 vibrates, and this vibration is converted to an electrical signal by the piezoelectric properties of the quartz crystal and is input to the oscillation circuit as the electrical signal. The output of the oscillation circuit is converted to a digital form and counted by the register circuit and the time counting circuit. Signals are transmitted and received to and from the control portion 112 via the interface circuit, and the current time and the current date or the calendar information or the like are displayed on the display portion 115.

The communication portion 114 is provided with the same functions as those of the cellular phone of the related art, and includes a wireless portion 117, an audio processing portion 118, a switching portion 119, an amplifier portion 120, an audio input/output portion 121, a telephone number input portion 122, a ring tone generation portion 123, and a call control memory portion 124.

The wireless portion 117 carries out transmission and reception of various kinds of data, such as audio data, with the base station via an antenna 125. The audio processing portion 118 encodes and decodes an audio signal input therein from the wireless portion 117 or the amplifier portion 120. The amplifier portion 120 amplifies a signal input therein from the audio processing portion 118 or the audio input/output portion 121 to a specific level. The audio input/output portion 121 is formed of a speaker and a microphone and the like, and makes a ring tone and incoming audio louder, as well as collecting sounds.

The ring tone generation portion 123 generates a ring tone in response to a call from the base station. The switching portion 119 switches the amplifier portion 120 normally connected to the audio processing portion 118 to the ring tone generation portion 123 only when a call arrives, so that the ring tone generated in the ring tone generation portion 123 is output to the audio input/output portion 121 via the amplifier portion 120.

The call control memory portion 124 stores a program relating to incoming and outgoing call control for communications. The telephone number input portion 122 includes, for example, numeric keys from 0 to 9 and other keys and the user inputs the telephone number of the communication party by depressing these numeric keys and the like.

The voltage detection portion 116 detects a voltage drop when a voltage being applied to each function portion, such as the control portion 112, by the power supply portion 111 drops below the predetermined value, and notifies the control portion 112 of the detection. The predetermined voltage value referred to herein is a value pre-set as the lowest voltage necessary to operate the communication portion 114 in a stable manner, for example, is about 3 V. Upon receipt of a notification of a voltage drop from the voltage detection portion 116, the control portion 112 disables the operation of the wireless portion 117, the audio processing portion 118, the switching portion 119, and the ring tone generation portion 123. In particular, it is essential to stop the operation of the wireless portion 117 that consumes a large amount of power. Furthermore, a message informing that the communication portion 114 is unavailable due to insufficient battery power is displayed on the display portion 115.

More specifically, it is possible to disable the operation of the communication portion 114 and display the notification message on the display portion 115 by the voltage detection portion 116 and the control portion 112. This message may be displayed as a character message, or as a more intuitive indication, which may be displayed by putting a cross mark on the telephone icon displayed at the top of the display screen of the display portion 115.

By providing a power shutdown portion 126 capable of selectively shutting down the power supply to portions involved with the function of the communication portion 114, it is possible to stop the function of the communication portion 114 in a more reliable manner.

According to the present embodiment, since the portable information device 110 includes the piezoelectric vibrator 1 which can be manufactured at a low cost, it is possible to reduce the cost of the portable information device 110.

Radio-Controlled Timepiece

Next, a radio-controlled timepiece according to an embodiment of the present invention will be described with reference to FIG. 16.

Figure 16:
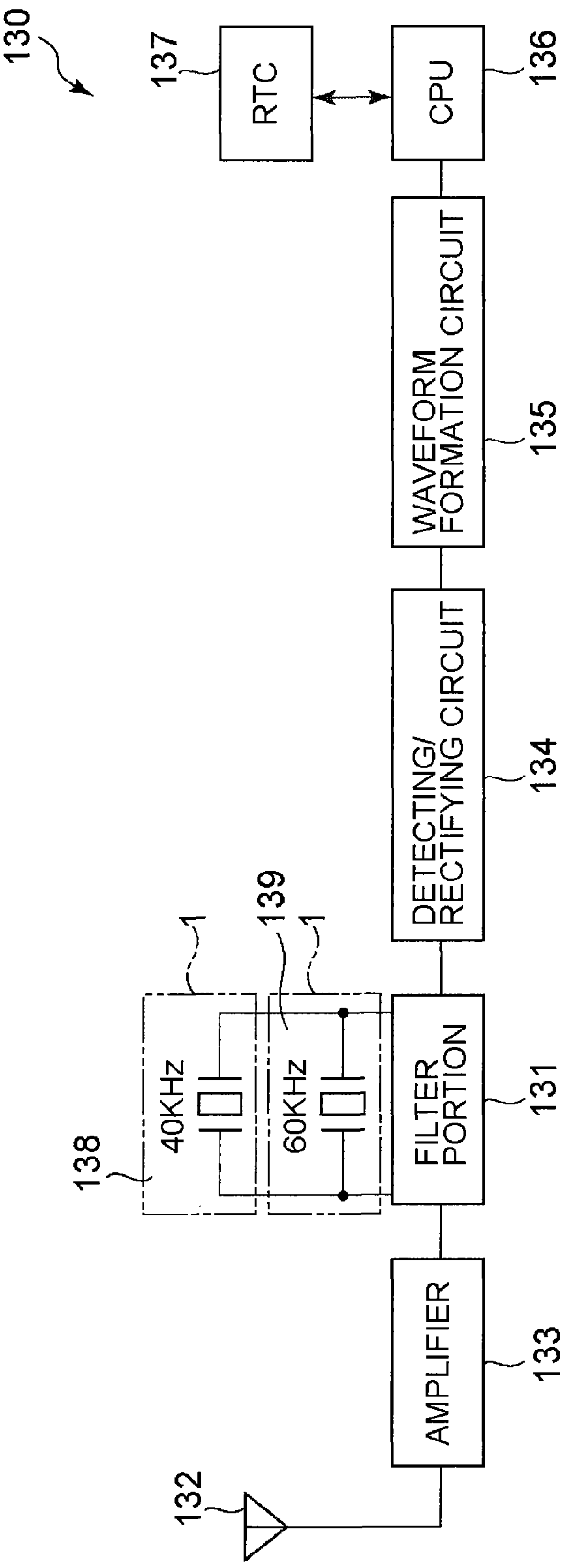
FIG. 16 is a view showing the configuration of a radio-controlled timepiece according to an embodiment of the present invention.

As shown in FIG. 16, a radio-controlled timepiece 130 of the present embodiment includes the piezoelectric vibrators 1 electrically connected to a filter portion 131. The radio-controlled timepiece 130 is a timepiece provided with the function of displaying the correct time by automatically correcting the time upon receipt of a standard radio wave including the timepiece information.

In Japan, there are transmission centers (transmission stations) that transmit a standard radio wave in Fukushima Prefecture (40 kHz) and Saga Prefecture (60 kHz), and each center transmits the standard radio wave. A wave as long as 40 kHz or 60 kHz is of a kind to propagate along the land surface and of a kind to propagate while reflecting between the ionospheric layer and the land surface, and therefore has a propagation range wide enough to cover all Japan through the two transmission centers.

Hereinafter, the functional configuration of the radio-controlled timepiece 130 will be described in detail.

An antenna 132 receives the long standard radio wave at 40 kHz or 60 kHz. The long standard radio wave is made up of time information called a time code which is modulated by the AM modulation scheme and carried on a carrier wave of 40 kHz or 60 kHz. The received long standard wave is amplified by an amplifier 133 and filtered and synchronized by the filter portion 131 having a plurality of piezoelectric vibrators 1.

In the present embodiment, the piezoelectric vibrators 1 include quartz vibrator portions (piezoelectric vibrating reeds) 138 and 139 having resonance frequencies at 40 kHz and 60 kHz which are the same as the carrier frequency.

Furthermore, the filtered signal at the specific frequency is detected and demodulated by a detection and rectification circuit 134. Subsequently, the time code is extracted by a waveform shaping circuit 135 and counted by the CPU 136. The CPU 136 reads out information about the current year, the total number of days, the day of the week, and the time and the like. The read information is reflected on the RTC 137 and the precise time information is displayed.

Because the carrier wave is 40 kHz or 60 kHz, a vibrator having the tuning-fork structure described above is suitable for the quartz vibrator portions 138 and 139.

Although the above description has been given of the example in Japan, the frequency of the long standard wave is different overseas. For example, a standard wave of 77.5 kHz is used in Germany. When the radio-controlled timepiece 130 which is also operable overseas is incorporated into a portable device, the piezoelectric vibrator 1 set at the frequency different from the frequencies used in Japan is required.

According to the present embodiment, since the radio-controlled timepiece 130 includes the piezoelectric vibrator 1 which can be manufactured at a low cost, it is possible to reduce the cost of the radio-controlled timepiece 130.

Although the embodiments of the present invention have been described in detail with reference to the drawings, the detailed configuration is not limited to the embodiments, and various changes can be made in design without departing from the spirit of the present invention.

For example, although the above-described embodiments have been described by way of an example of the grooved piezoelectric vibrating reed 4 in which the groove portions 15 are formed on both surfaces of the vibrating arms 10 and 11 as an example of the piezoelectric vibrating reed 4, the piezoelectric vibrating reed 4 may be a type of piezoelectric vibrating reed without the groove portions 15. However, since the field efficiency between the pair of the excitation electrodes 13 when a predetermined voltage is applied to the pair of excitation electrodes 13 can be increased by forming the groove portions 15, it is possible to suppress the vibration loss further and to improve the vibration properties much more. That is to say, it is possible to decrease the CI value (crystal impedance) further and to improve the performance of the piezoelectric vibrating reed 4 further. In this respect, it is preferable to form the groove portions 15.

Moreover, although in the above-described embodiments, the base board 2 and the lid board 3 are anodically bonded by the metal film 27 or the bonding film 71, the bonding method is not limited to the anodic bonding. However, the anodic bonding is preferable because the anodic bonding can tightly bond both boards 2 and 3.

Furthermore, although in the above-described embodiments, the piezoelectric vibrating reed 4 is bonded by bumps, the bonding method is not limited to the bump bonding. For example, the piezoelectric vibrating reed 4 may be bonded by a conductive adhesive agent. However, since the bump bonding allows the piezoelectric vibrating reed 4 to be floated from the inner surface of the base board 2, it is naturally possible to secure the minimum vibration gap necessary for vibration of the piezoelectric vibrating reed 4. Therefore, bump bonding is preferable.

In addition, although in the above-described embodiments, the shielding walls 21 are formed integrally with the lid board 3, the present invention is not limited to this as long as the shielding walls 21 are connected to both the base board 2 and the lid board 3 in the cavity C and shield the piezoelectric vibrating reed 4 from the gettering materials 72 (the metal film 27). For example, the shielding walls may be formed integrally with the base board 2 and the end surfaces thereof may be in contact with or bonded to the lid board 3. Moreover, the shielding walls may be formed by separate members different from the base board 2 and the lid board 3, and both end surfaces thereof may be separately in contact with or bonded to the base board 2 and the lid board 3.

In addition although in the above-described embodiments, the cavity C is formed by the recess portion 3*a* formed on the lid board 3, the present invention is not limited to this. For example, a recess portion for the cavity may be formed on the base board 2, and a recess portion may be formed on both the base board 2 and the lid board 3.

In addition, although in the above-described embodiments, the shielding walls 21 are formed on both outer sides in the array direction of the pair of vibrating arms 10 and 11 so as to extend in the longitudinal direction of the vibrating arms 10 and 11, the present invention is not limited to this as long as the shielding walls 21 shield the piezoelectric vibrating reed 4 from the gettering materials 72 (the metal film 27). For example, the shielding walls 21 may be formed on the outer side in the longitudinal direction than the tip ends of the vibrating arms 10 and 11.

Besides, within a range not deviating from the object of the present invention, constituent elements of the above-described embodiments may be appropriately substituted with well-known constituent elements, and the above-described modified examples may be appropriately combined.

The invention claimed is:

1. A piezoelectric vibrator comprising:

a hermetically closed casing comprising first and second substrates with a cavity formed therebetween;

a first partitioning wall erected inside the cavity for defining, in the cavity, first and second spaces communicating with each other;

a piezoelectric vibrating strip secured inside the first space in cavity; and a getter material placed inside the second space in the cavity, wherein the first partitioning wall is configured to conceal the piezoelectric vibrating strip and the getter material from each other.

2. The piezoelectric vibrator according to claim 1, wherein the getter material has a laser mark.

3. The piezoelectric vibrator according to claim 1, further comprising a bonding film placed between the first and second substrate for anodically bonding the first and second substrates, wherein the bonding film has a gettering characteristic and constitutes the getter material inside the second space.

4. The piezoelectric vibrator according to claim 1, further comprising a second partitioning wall erected inside the cavity for defining a third space in the cavity which communicates with the first and second spaces.

5. The piezoelectric vibrator according to claim 4, further comprising the getter material in the third space.

6. An oscillator comprising the piezoelectric vibrator defined in claim 1.

7. An electronic device comprising the piezoelectric vibrator defined in claim 1.

8. The electronic device according to claim 7, wherein the electronic device is an atomic clock.

9. A piezoelectric vibrator comprising:

a hermetically closed casing comprising first and second substrates with a cavity formed therebetween;

a first partitioning wall erected inside the cavity for defining, in the cavity, first and second spaces communicating with each other;

a piezoelectric vibrating strip secured inside the first space in cavity;

a getter material placed inside the second space in the cavity; and a bonding film placed between the first and second substrate for anodically bonding the first and second substrates, wherein the bonding film has a gettering characteristic and constitutes the getter material inside the second space.

10. A piezoelectric vibrator comprising:

a hermetically closed casing comprising first and second substrates with a cavity formed therebetween;

a first partitioning wall erected inside the cavity for defining, in the cavity, first and second spaces communicating with each other;

a second partitioning wall erected inside the cavity for defining a third space in the cavity which communicates with the first and second spaces;

a piezoelectric vibrating strip secured inside the first space in cavity; and a getter material placed inside the second and third spaces in the cavity, wherein the first partitioning wall is configured to conceal the piezoelectric vibrating strip and the getter material from each other.

* * * * *